United States Patent [19]

Maydan et al.

[11] Patent Number: 4,668,338
[45] Date of Patent: May 26, 1987

[54] MAGNETRON-ENHANCED PLASMA ETCHING PROCESS

[75] Inventors: Dan Maydan, Los Altos Hills; Sasson Somekh, Redwood City; Mei Cheng; David Cheng, both of San Jose, all of Calif.

[73] Assignee: Applied Materials, Inc., Santa Clara, Calif.

[21] Appl. No.: 814,638

[22] Filed: Dec. 30, 1985

[51] Int. Cl.[4] .................. H01L 21/306; B44C 1/22; C03C 15/00; C03C 25/06
[52] U.S. Cl. .................................... 156/643; 156/646; 156/653; 156/657; 156/659.1; 156/662; 156/345; 204/298; 204/192.32
[58] Field of Search ............... 156/643, 646, 653, 657, 156/659.1, 662, 345; 204/192 EC, 192 E, 298; 427/38, 39; 118/50.1, 620, 621, 623, 728, 729

[56] References Cited

U.S. PATENT DOCUMENTS

| | | | |
|---|---|---|---|
| 3,884,793 | 5/1975 | Penfold et al. | 204/298 |
| 4,126,530 | 11/1978 | Thornton | 204/192 EC |
| 4,422,896 | 12/1983 | Class et al. | 156/643 |
| 4,434,042 | 2/1984 | Keith | 204/298 |
| 4,492,610 | 1/1985 | Okano et al. | 156/643 |

OTHER PUBLICATIONS

Hinkel et al., Method of Increasing the Deposition and Etch Rates in Plasma Processes, IBM Technical Disclosure Bulletin, vol. 25, No. 7A, Dec. 1982, p. 3161.
Heiman, Method for Magnetically Assisted Sputter Etching and Deposition, IBM Tech. Discl. Bulletin, vol. 23, No. 9, Feb. 1981, p. 4295.
Horiike et al., High-Rate Reactive Ion Etching of SiO$_2$ Using a Magnetron Discharge, Japanese Journal of Applied Physics, vol. 20, No. 11, Nov. 1981, pp. L817-L820.

Primary Examiner—William A. Powell
Attorney, Agent, or Firm—Flehr, Hohbach, Test, Albritton & Herbert

[57] ABSTRACT

A magnetically-enhanced, variable magnetic field, RIE mode plasma etch process for etching materials such as dielectrics and polycrystalline, is disclosed. The variable magnetic field permits optimization of selected characteristics such as etch rate, etch selectivity, ion bombardment and radiation damage, etch uniformity, and etch anisotropy.

14 Claims, 8 Drawing Figures

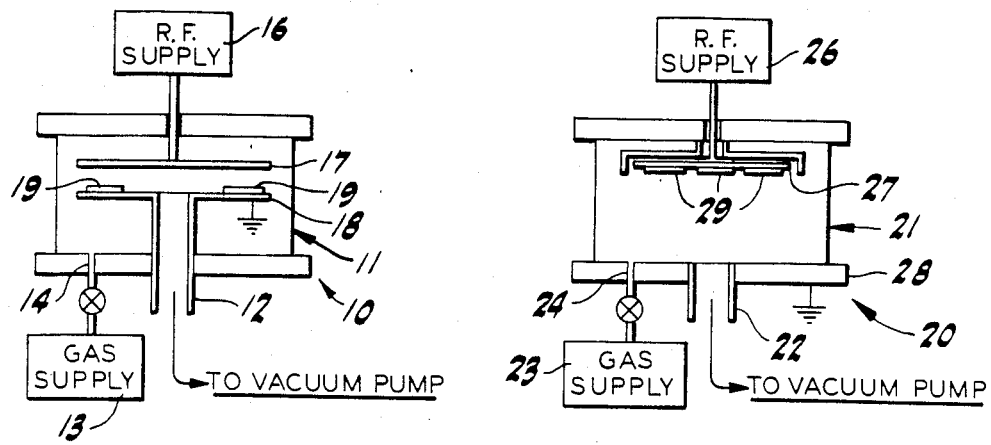
FIG-1 PRIOR ART
FIG-2 PRIOR ART
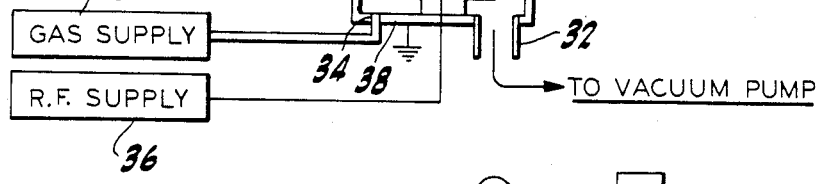
FIG-3 PRIOR ART
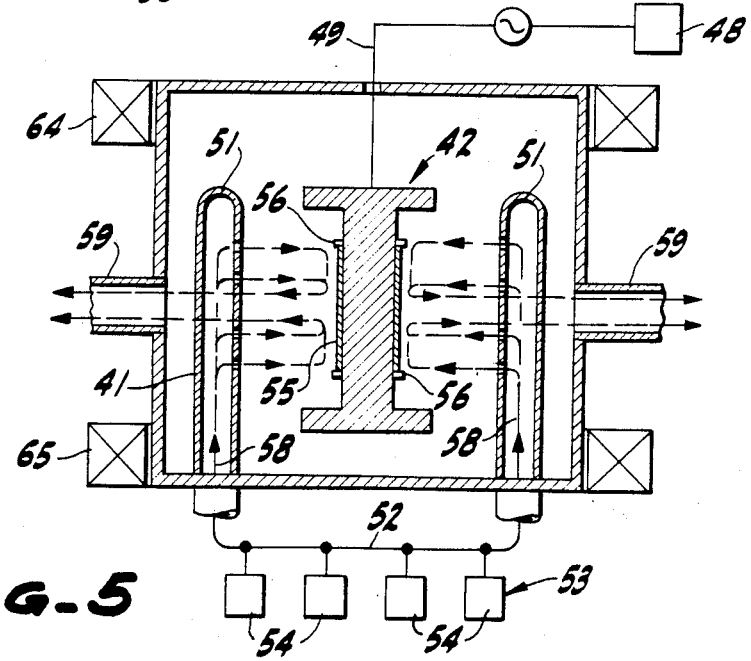
FIG-5

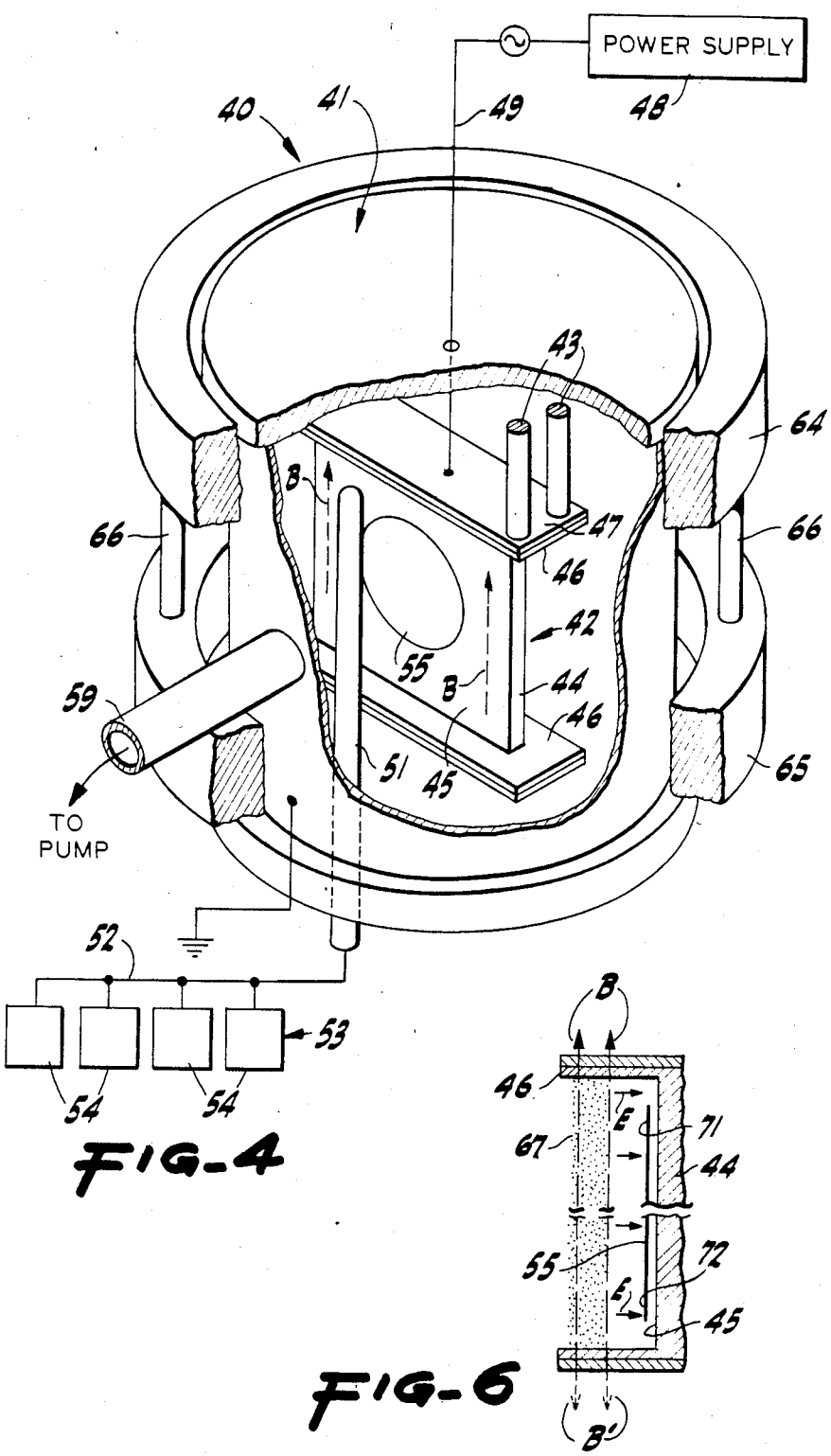

MAGNETRON-ENHANCED PLASMA ETCHING PROCESS

BACKGROUND OF THE INVENTION

The present invention relates to a magnetic field-enhanced plasma etching process and, in particular, to a process for etching semiconductor and dielectric materials in a magnetic field-enhanced reactive ion etching (RIE) mode.

The trend towards greater device densities and smaller minimum feature sizes and smaller separations in integrated circuits has imposed increasingly stringent requirements on the basic IC fabrication steps of masking, film formation (by deposition or oxidation), doping and etching. For example, and relevant to the present invention, wet chemical etching was for years the predominant commercial etching technique. However, effective use of currently available photolithographic techniques is not possible using wet chemical etchants because of the isotropic nature of the process. Also, because of surface tension, wet chemical etchants have difficulty penetrating narrow mask apertures and narrow cuts such as deep narrow silicon trenches. Furthermore, wet chemical etchants may be toxic. This characteristic, as well as their causticity can make wet chemical etchants dangerous to handle and use. Consequently, much effort has been expended toward developing commercially useful plasma etching technology. The plasma etching technology has the potential to provide improvements in directional etching (anisotropic etching) and also greater safety, since plasma etching equipment involves a closed reaction chamber and thus does not involve exposure to liquid chemicals.

The art includes at least three types of plasma etching systems. FIGS. 1 and 2 depict the differences in the structure and operation of a parallel plate plasma chemical etching system, 10, FIG. 1, and a parallel plate reactive ion etching system, 20, FIG. 2. The common aspects of the two systems 10, 20 are that each includes a substantially closed reaction chamber 11, 21 with a connection 12, 22 to a vacuum pump for partially evacuating the interior of the chamber, and a gas supply 13, 23 for communicating the reactive gas to the chamber through a valve conduit arrangement 14, 24. Each of the systems utilizes an energy source 16, 26 supplying RF energy to a cathode structure 17, 27. Furthermore, each of the systems utilizes a grounded anode 18, 28.

In the plasma chemical etching system 10 the wafers 19 are mounted on the grounded anode 18 which extends in a parallel plate configuration relative to the cathode 17. The connection to the vacuum pump is configured to draw the reactive gases into the region between the anode 18 and the cathode 17 for confining the reactive gas plasma formed by the RF energy supplied to the cathode 17. In contrast, in the reactive ion etching system 20, the wafers are mounted on the cathode 27, which is shielded from and separated from the anode 28.

The parallel plate plasma system 10 is a relatively high pressure system, operating in the pressure range of 100 millitorr to several torr, and thus involves a substantial flow rate of reactive gases into the system. In contrast, the reactive ion etching system 20 is operated at low pressures in the range of 1 to 100 millitorr and, thus, substantially lower gas flow rates are utilized. In the reactive ion etching system 20, activated ion species in the neighborhood of the cathode have high inherent directionality normal to the cathode and the wafers mounted thereon. By using high frequency RF energy at fairly substantial power levels, substantial etch rates can be achieved, despite the low concentration of activated species, by enhancing the chemical reaction between the activated species and the material to be etched due to the momentum of the ions bombarding exposed material regions on the wafer surface.

Improved directionality of the activated species in the parallel plate plasma system 10 can be achieved by utilizing lower RF frequencies to generate electric fields in the region of the anode which enhance ion bombardment of the wafers 19 and directionality of the etch. However, this is achieved at lower etch rates and at increased risk of metal contamination because the physical bombardment of the anode releases metal particulates.

FIG. 3 schematically illustrates an etching system 30 that is a presently preferred system for a number of reactive ion etching (RIE) mode plasma etching applications. In RIE mode systems such as 30 (and 20), the highly directional mechanical ion bombardment etch component dominates the more isotropic chemical component and imparts high anisotropy to the etching characteristics of the system. Consequently, RIE mode systems are preferred for the etching fabrication steps of highly dense, small feature-size IC applications such as VLSI circuits.

The RIE system 30 is available commercially from Applied Materials, Inc. of Santa Clara, Calif. as the 8100 Series System. The system 30 includes a cylindrical reaction chamber 31 and a hexagonal cathode 37 connected to an RF supply 36. An exhaust port 32 communicates between the interior of the reaction chamber 31 and a vacuum pump. The walls of the reaction chamber 31 and the base plate 38 form the grounded anode of the system. A supply of reactive gas from gas supply 33 is communicated to the interior of the chamber 31 through an entrance port 34 and through a conduit arrangement 41 to a gas distribution ring 42 at the top of the chamber.

The geometry of reactor 30 is asymmetric. That is, the anode-to-cathode ratio is slightly greater than two-to-one, resulting in high energy bombardment of the cathode surface 37 relative to the anode surface 31. Such a design provides lower power density and better etch uniformity, decreases contamination from the chamber walls and provides greater etch anisotropy. Additionally, the cathode structure configuration allows all wafers to be vertically oriented during the process to minimize wafer exposure to the particulates.

In general, RIE mode plasma etching is affected by the geometry of the reactor and by the process parameters pressure, power and gas flow. The geometry, of course, is fixed. There is also considerable process parameter inertia in that it is difficult to change process parameters such as the chamber pressure and gas flows during etching. It is difficult to simultaneously satisfy process requirements such as high etch rate, high anisotropy and high selectivity for masks and underlying layers using fixed gas composition, flow, power and pressure. Consequently, the typical etch sequence involves the use of a combination of fixed process parameters which are selected to compromise among, or optimize one of, the various competing etch characteristics.

Furthermore, it is difficult to meet the changing requirements during an etch sequence using a fixed set of process parameters. Consider, for example, etching polycide structures (typically, refractory metal silicide on polycrystalline silicon) or, in particular, etching polycides formed on thin dielectric layers such as gate oxide thickness oxides. The metal silicide etch must provide a vertical silicide profile and a high selectivity for polysilicon. The polysilicon etch must provide a vertical polysilicon profile along with high selectivity for both silicide and the underlying oxide. In addition, the overall silicide etch process should provide a high selectivity for the mask material.

Commonly assigned, co-pending U.S. patent application Ser. No. 786,783, entitled "Materials and Methods for Etching Silicides, Polycrystalline Silicon and Polycides", filed Oct. 11, 1985, in the name of Wang et al meets the above objectives using the same base etching gas composition for both the silicide and the polysilicon and also using similar pressure, power and flow rates for both the silicide and the polysilicon etch steps. In general, however, the art has found it difficult (1) to optimize characteristics such as etch rate, anisotropy and selectivity using a fixed combination of pressure, power and flow or (2) to etch multiple layers using a fixed set of pressure, power and flow parameters. As a result, the art frequently has had to accept less than optimum etch characteristics or has resorted to multiple-step etch sequences involving different combinations of pressure, power, gas composition and flow rates.

SUMMARY OF THE INVENTION

In view of the above, it is a primary object of the present invention to provide an additional degree of freedom to the RIE mode plasma etch process.

It is a related object to provide an additional degree of freedom to RIE mode plasma etching which permits better optimization of various, possibly conflicting, etch requirements such as the etch rate, anisotropy and selectivity.

It is a related object to be able to quickly, change etch process parameters and the resulting etch characteristics in response to changing requirements when etching a single material or several materials.

The above and other aspects of the present invention are provided by the addition of a magnetic field to RIE mode plasma etching and, in particular, by the use of a variable magnetic field during RIE mode plasma etching. The variable field can be provided by an electromagnet and, preferably, by a Helmholtz configured electromagnet. The variable magnetic field provides an additional degree of freedom to the several relatively fixed factors such as power, pressure, gas composition and flow rate which are used in the art to control RIE mode plasma etching. Thus, for example, a material can be etched using a magnetic field to provide a high etch rate, then toward the end of the etch step the field can be reduced or eliminated to provide a lower etch rate and a higher selectivity for underlying material. Also, the direction of the magnetic field can be reversed or changed during the etch process to provide enhanced etch uniformity across the etched surface.

BRIEF DESCRIPTION OF THE DRAWINGS

The above and other aspects and advantages of the present invention are described with respect to the attached drawings, in which:

FIGS. 1 through 3 schematically depict three types of plasma etching systems which are available in the art;

FIG. 4 is a perspective view, partially in schematic form, of one embodiment of a magnetically enhanced RIE mode plasma etch system which can be used to practice our invention;

FIG. 5 is a vertical cross-section, partly schematic, of FIG. 4;

FIG. 6 is a vertical cross-section, partly schematic, through the wafer-holding electrode of the chamber shown in FIG. 4;

DETAILED DESCRIPTION OF THE INVENTION

Etching System

Figure 8:
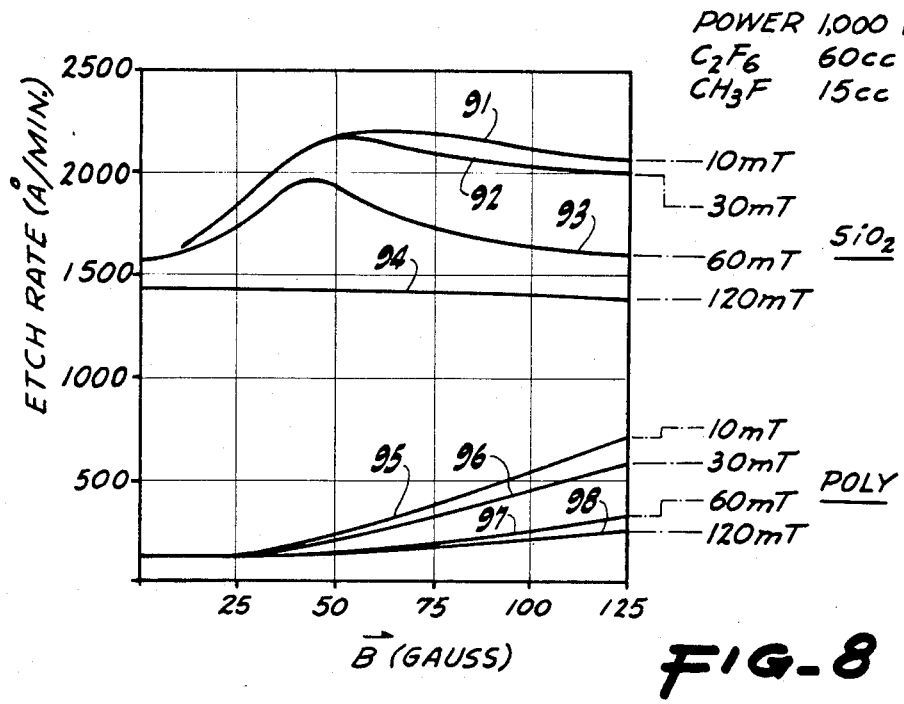
FIG. 8 depicts oxide and polysilicon etch rates as a function of magnetic field strength using an etching gas comprising $C_2F_6$ and $CH_3F$.

FIG. 4 illustrates an RIE mode plasma etching system 40 which can be used to practice the process of the present invention. The system 40 is a modification of the magnetron RIE mode CVD deposition system disclosed in co-pending, commonly assigned allow U.S. patent application Ser. No. 664,657, entitled "Apparatus and Method for Magnetron-Enhanced Plasma-Assisted Chemical Vapor Deposition", filed Oct. 25, 1984, in the name of Foster et al. The Foster et al application is hereby incorporated by reference. The system 40 includes a cylindrical stainless steel vacuum chamber 41 which mounts a flanged cathode assembly 42 therein. The cathode 42 is insulatingly mounted within and insulated from the chamber 41 by insulating mounting posts 43—43. In a preferred embodiment, the cathode 42 comprises a polygonal axial section 44 of two or more sides and inner end reflector sections 46—46 which are formed of aluminum or other conductive non-magnetic material. Outer end sections 47—47 are formed of insulating material, such as Maycor ® insulating material. Power is supplied for plasma operation by an RF system 48, typically a 13.6 MHz system, which includes an RF power supply and a load matching network and is connected to the cathode 42 by insulated power lead 49. Reactant gas is communicated to the interior of chamber 41 by one or more inlet tubes 51 which are coupled by gas supply lines 52 to a gas supply system 52. This system includes a number of gas storage tanks or reservoirs 54—54 which supply the reactant gases to the chamber 41.

Referring also to the cross-sectional view of the chamber 41 shown in FIG. 5, semiconductor wafers 55 are held by means 56, such as clips, at the side of the cathode. Typically, a gas inlet tube 51 is positioned adjacent each cathode face. Alternatively, nozzles, apertured flat manifolds or the gas inlet rings disclosed in the Foster et al patent application can be used. As indicated by arrows 58, the reactant gas flows across substrate surface and to one or more exhaust outlets 59 in the chamber wall. The exhausts 59 are connected to a mechanical pump (not shown) via a vacuum valve and Roots blower. This arrangement facilitates uniform coverage and etching of the substrate by the reactant gas. Control of the system can be provided via a capacitance manometer sensor (not shown) which operates through a pressure control system and DC motor to control the speed of the blower.

Electromagnets 64 and 65, typically formed of copper coils (not shown), are circumferentially positioned about the chamber 41 near the top and bottom thereof. The electromagnets form north and south poles which are reversible by reversing the coil current. In particular, the chamber dimensions and coils form a Helmholtz configuration in which the coil separation, which is precisely maintained by the mounting standoffs 66—66, is approximately one-half the coil diameter. In this configuration, the electromagnets form a uniform magnetic field over substantially the entire diametrical cross-section of the chamber. The reversible parallel magnetic field lines, indicated by arrows B—B, are substantially parallel to the cylinder axis and to the cathode faces 45 (FIG. 5). Thus, in positioning the cathode 44 and the wafers/substrates 55 parallel to the cylinder axis (the cathode is transparent to the magnetic field lines), the magnetic field lines are formed parallel to the major surface of the substrates. As a consequence of the Helmholtz configuration, the electrode 42 can be formed as a two-side polygon, as a multi-side polygon, or as other shapes, and still provide a uniform magnetic field parallel to the wafers so long as the wafers are held parallel to the cylinder axis.

Referring to FIGS. 4 and 6, during RIE mode plasma etching operation of the reactor system 40, a selected etching gas or etching gas mixture is inlet from the gas supply 53 via line(s) 52 through the inlet tubes 51—51 to the reaction chamber 41, which is evacuated by the exhaust pump system. As shown in FIG. 6, application of RF power from the power supply 48 creates a low pressure, reactant gas discharge or plasma 67 of electrons, ions and disassociated species in the vicinity of the semiconductor wafers 55. An electric field E is formed across the plasma shield or dark space directed from the positive potential etching plasma toward the surface 45 of the electrode central section 44. This field accelerates electrons across the sheath away from the electrode surface and accelerates positive ions across the sheath toward the electrode 44 and the wafer 55 to provide the directional ion bombardment etch component which is characteristic of RIE mode plasma etching.

The uniform reversible magnetic field, B, FIG. 6, is applied to the chamber 41 parallel to the substrates 55 and perpendicular to the electric field to control the characteristics of the etch process. The field direction, $\vec{B}$, is reversed by reversing the current in the coils 64 and 65. The electrons are confined by the magnetic field lines, which prevent the electrons from moving easily from the cathode face 45 to the anode 41. Also, the magnetic and electric fields impart an $\vec{E} \times \vec{B}$ drift velocity to the electrons so that they tend to drift and to jump from point to point along the cathode surface. The electrons are concentrated in a band having a net drift velocity along the cathode and substrate. In conjunction with the end reflectors 46—46, the $\vec{E} \times \vec{B}$ drift velocity tends to confine the electrons within the plasma.

The effect of magnetic fields in confining electrons is known. Also, electromagnets have been used to provide variable strength magnetic field-enhanced magnetron CVD mode deposition and deposition combined with etching effects, as described in the above-referenced co-pending allowed U.S. patent application in the name of Foster et al. However, to our knowledge, variable strength and/or reversible magnetic fields have not been used previously in RIE mode plasma etching processes as described here, with the results described below.

In using the above etching system 40 for magnetically-enhanced RIE mode etching, we have found that reversing the magnetic field (by reversing the current in coils 64 and 65) increases etch uniformity. Referring to FIG. 6, the etching rate is greater on the end or side 71 of the wafers corresponding to the positive side of the magnetic field. Reversing the current through the coils 64 and 65 reverses the direction of the magnetic field across the wafers, as shown in phantom at B' in FIG. 6. This reverses the plasma flow so that the higher etching rate is switched to the opposite end 72 of the wafer. The etch rates and the total etching across the wafer are averaged by reversing the magnetic field and are thereby made more uniform.

We have also found that the use of a magnetic field increases the etch anistropy of certain materials, such as polysilicon and aluminum. The etch anisotropy of oxides such as silicon dioxide is relatively unaffected by the use of a magnetic field. Where the etch anisotropy is increased, it is believed the magnetic field causes or enhances the formation of species which deposit on the material sidewalls during etching and thereby inhibit lateral etching.

Furthermore, we have discovered that increasing the strength of the magnetic field decreases the impedance and the voltage required for a given power level (P=Vi), and lowers the associated bombardment energy. In turn, the lower bombardment energy decreases radiation damage to the etched material.

The reactor system 40 was used to etch two types of composites: polysilicon-on-silicon dioxide and silicon dioxide-on-polysilicon. The poly-on-oxide composites were formed by growing the silicon dioxide by thermal oxidation of a silicon substrate, then depositing polysilicon on the oxide. The second type of composite, oxide-on-poly, was formed by depositing a layer of polysilicon on a silicon substrate using chemical vapor deposition, then thermally growing the silicon dioxide from the polysilicon layer. The poly-silicon in both composites was doped n-type with phosphorus to a level of about 15 ohms per square. The polysilicon layer and the silicon oxide layer in each composite were etched using the system 40 of FIG. 4.

For the poly-on-oxide composites, a conventional polysilicon etching gas mixture of HCl and $Cl_2$ was used to etch the oxide layer as well as the poly layer. In etching the oxide-on-poly composites, an etching gas mixture of $C_2F_6$ and $CH_3F$ was used to etch both the oxide and the underlying poly.

The poly etch rates and oxide etch rates in Angstroms per minute were determined as a function of the field strength, $\vec{B}$, over the approximate range 0 to 120 gauss. This characterization involved measuring the film thickness before and after etching using the four point probe technique. The etch rates were then calculated from the change in film thickness and the etching times. The resulting etch rate data are depicted in FIGS. 7 and 8.

Figure 7:
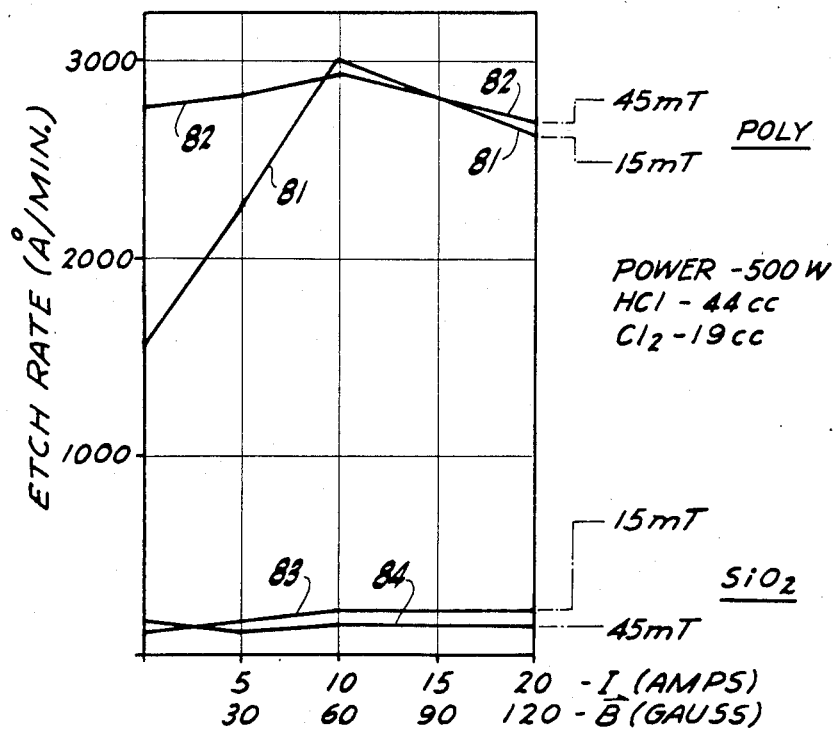
FIG. 7 depicts polysilicon and oxide etch rates as a function of magnetic field strength using an etching gas comprising HCl and $Cl_2$.

FIG. 7 illustrates the effect of increasing the strength of a D.C. magnetic field on the etch rates of the polysilicon and the oxide in the poly-on-oxide composites. That is, this figure depicts the variation in polysilicon and silicon dioxide etch rates using the HCl and $Cl_2$ gas chemistry by increasing the magnetic field. Curves 81 and 82 show the variation in the polysilicon etch rates as a function of magnetic field using HCl and chlorine flow rates of 44 and 19 sccm, power of 500 watts, and chamber pressure of 15 millitorr and 45 millitorr, respectively.

As shown by curve 82, at the higher chamber pressure of 45 millitorr, the polysilicon etch rate is relatively unaffected by the magnetic field. The polysilicon etch rate increases from about 2750 Angstroms per minute to approximately 2900 Angstroms per minute at 60 gauss, then decreases slightly to about 2700 Angstroms per minute at 120 gauss.

The etch rate for the 15 millitorr curve 81, unlike the 45 millitorr curve 82, increases rapidly from about 1500 Angstroms per minute to a maximum of about 3000 Angstroms per minute at 60 gauss then, like the 45 millitorr curve 82, decreases slightly to an etch rate of about 2600 Angstroms per minute at 120 gauss.

Curves 83 and 84 depict the silicon dioxide etch rates which are provided by the same etch parameters used to obtain the polysilicon etch curves 81 and 82. The 15 millitorr thermal oxide etch curve 83 increases slightly from a value of about 100 Angstroms per second as the magnetic field is initially increased from 0 gauss to 60 gauss, then levels off to a nearly constant value of about 150 Angstroms per minute over the range 60 to 120 gauss. The 45 millitorr thermal oxide etch curve 84 decreases slightly initially, then maintains a nearly constant value of about 100 Angstroms per minute over the range 30 to 120 gauss.

The etch selectivity for oxide was high over the range of 0 to 120 gauss. Comparing the etch rates associated with the 15 millitorr poly etch curve 81 to the corresponding rates for the 15 millitorr oxide etch curve 83, the poly:oxide etch rate ratio varied from about 15:1 to about 20:1 over the investigated range of 0 to 120 gauss (1500:100 or 15:1, 3000:150 or 20:1 and 2600:150 or 17:1 at 0, 60 and 120 gauss). The etch rate ratio provided by the 45 millitorr poly and oxide etch curves 82 and 84 varied from about 18:1 to about 29:1 (2750:150 or 18:1, 2900:100 or 29:1 and 2700:100 or 27:1 at 0.60 and 120 gauss). Thus, while a good combination of poly etch rates and poly:oxide etch rate ratios occurs at 0–120 gauss for chamber pressure of 45 millitorr and at field strengths greater than about 60 gauss for a chamber pressure of 15 millitorr, an optimum combination of maximum polysilicon etch rate and high polysilicon:oxide etch rate ratio is provided at about 60 gauss for both chamber pressures.

To summarize regarding the data depicted in FIG. 7 and the other disclosure regarding magnetic field-enhanced RIE mode plasma etching, this approach provides (1) using the standard HCl and chlorine etching gas composition, a maximum polysilicon etch rate of about 3000 Angstroms per minute, at a magnetic field strength of about 60 gauss; (2) the combination of high polysilicon etch rates and high selectivity for oxide; (3) an optimum combination of polysilicon etch rate and selectivity for oxide at a magnetic field strength of about 60 gauss; and (4) in general, enhancement of etch uniformity, enhancement of etch anisotropy and decreased bombardment energy and radiation damage.

FIG. 8 illustrates the effect of the magnetic field on the etch rates of the oxide and the polysilicon in the oxide-on-poly composites. That is, this figure depicts the variations in oxide and polysilicon etch rates which are achieved using the $C_2F_6$ and $CH_3F$ gas chemistry by increasing the magnetic field.

Curves 91, 92, 93 and 94 depict the oxide etch rates associated, respectively, with 10, 30, 60 and 120 millitorr chamber pressure, and power of 1000 watts. The oxide etch curves 91–93 indicate that the oxide etch rates for the three lower chamber pressure values increase as the magnetic field is increased, peak, then decrease. As an approximation, at the three lower chamber pressures, magnetic field strengths within the range of about 40–65 gauss provide the highest oxide etch rates and, thus, are the most preferred where maximizing the oxide etch rate is of primary importance. In contrast, the etch rate for the highest pressure curve, oxide etch rate curve 94, is an essentially constant value of about 1400 Angstroms per minute.

Curves 95 through 98 depict the polysilicon etch rates provided by the same parameters described above. The polysilicon etch rates increase slightly as the magnetic field is increased. The rate of the increase is an inverse function of pressure. That is, the polysilicon etch rate increases faster as the pressure is lowered. The highest oxide:polysilicon etch rate ratios of about 14:1 to 17:1 are obtained over the approximate range 0 to 40 gauss. As the magnetic field is increased above this range, the etch rate ratio decreases, to a value of about 3:1 to 7:1 at 125 gauss.

The FIG. 8 data indicated that use of the variable D.C. magnetic field makes possible the desirable procedure of (1) initially applying a magnetic field to maximize the oxide etch rate and obtain the previously mentioned enhanced etch anisotropy, enhanced etch uniformity, and decreased ion bombardment and radiation damage; then (2) decreasing or removing the magnetic field when the oxide is etched nearly through, to provide the optimum combination of high oxide:polysilicon etch rate ratio and high selectivity for polysilicon. Using the etching gas composition comprising $C_2F_6$ and $CH_3F$, and taking the approximate ranges from the data depicted in FIG. 8, one could start the oxide etch process using an initial magnetic field strength of about 40–65 gauss (depending upon the pressure) to maximize the oxide etch rate, then decrease the field strength to 0–40 gauss toward the end of the oxide etch (before the oxide is etched through) to optimize the combination of oxide etch rate and selectivity. Such a procedure is very desirable, for example, when etching contact vias in oxide isolation layers formed over polysilicon interconnect conductors. Alternatively, it may be suitable to select a single constant magnetic field strength (e.g., about 40 gauss, FIG. 8) which provides an optimum combination of relatively high etch rate and relatively high etch selectivity for polysilicon without the use of the two step, high/low magnetic field strength approach. Furthermore, and more generally, when etching oxides it is desirable to apply a magnetic field to enhance one or more of the etch rate, etch anisotropy, etch uniformity and (to decrease) bombardment energy.

Those of skill in the art will readily adapt the present invention as described above to the use of other etching compositions and to the etching of other materials and composite structures which are within the scope of the invention disclosed herein and defined in the following claims.

We claim:

1. A method for continuously etching in a closed chamber a structure comprising at least one of a dielectric layer and a semiconductor layer formed on or over a surface of a substrate, comprising:

communicating into said chamber a selected reactive gas mixture;

supplying RF electrical energy to said chamber to establish an etching plasma and and an associated electric field substantially perpendicular to said surface;

applying a variable D.C. magnetic field to the chamber at a selected first field strength and a first direction substantially perpendicular to said electric field and parallel to the substrate major surface; and changing at least one of (A) the strength of the magnetic field and (B) the direction thereof to, respectively, (A) a second value for enhancing etch selectivity and (B) a second direction still perpendicular to said electric field and parallel to said substrate major surface for increasing etch uniformity across the etched layer major surface.

2. The method of claim 1, wherein the structure is an oxide layer formed on a layer of polysilicon and wherein the first field strength is selected to provide a high oxide etch rate, then before the oxide is etched through, the magnetic field is decreased to a lower second value selected to increase the oxide:polysilicon etch rate ratio.

3. The process of claim 1 or 2, wherein at an intermediate stage during the etch process the direction of the magnetic field is reversed, still parallel to the substrate major surface, to enhance etch uniformity across the etched layer.

4. A method for continuously etching in a closed chamber a first layer formed on a second layer, comprising:

communicating into said chamber a selected reactive gas mixture;

supplying RF electrical energy to said chamber to establish an etching plasma and an associated D.C. voltage substantially perpendicular to said layers;

applying to the chamber a variable D.C. magnetic field which is substantially parallel to said layers and at a first strength selected to etch the first layer at a high rate; and before the first layer is etched through, changing the strength of the magnetic field to a second, lower value to increase the etch selectivity for the second layer.

5. The process of claim 4, wherein the direction of the magnetic field is reversed, still parallel to said layers at an intermediate stage of the etch process, to enhance etch uniformity across the first layer.

6. The method of claim 4 or 5, wherein the first layer is oxide and the second layer is polysilicon.

7. The process of claim 4 or 5, wherein the first layer is silicon oxide, the second layer is polysilicon and the reactive gas mixture comprises $C_2F_6$ and $CH_3F$.

8. The process of claim 4 or 5, wherein the first layer is silicon oxide, the second layer is polysilicon, the reactive gas mixture comprises $C_2F_6$ and $CH_3F$, and wherein the first and second field strengths are $\geq$ about 40 gauss and $\leq$ about 40 gauss, respectively.

9. The process of claim 4 or 5, wherein the first layer is silicon oxide, the second layer is polysilicon, the reactive gas mixture comprises $C_2F_6$ and $CH_3F$, and wherein the first and second field strengths are about (40–65) gauss and $\leq$ about 40 gauss.

10. A method for etching in a closed chamber a first layer formed on a second layer, comprising:

communicating into said chamber a selected reactive gas mixture;

supplying RF electrical energy to said chamber to establish an etching gas plasma and an associated DC voltage substantially perpendicular to said layers; and applying a magnetic field to the chamber substantially parallel to said layers at a field strength value selected to etch the first layer at an optimum high rate and with an optimum high selectivity relative to the second layer.

11. The process of claim 10, wherein the direction of the magnetic field is reversed during the etch process to enhance etch uniformity across the first layer.

12. The process of claim 10 or 11, wherein the first and second layers are polysilicon and silicon oxide, respectively.

13. The process of claim 10 or 11, wherein the first and second layers are polysilicon and silicon oxide, respectively, and the reactant gas mixture comprises HCl and chlorine.

14. The process of claim 10 or 11, wherein the first and second layers are polysilicon and silicon oxide, respectively, the reactant gas mixture comprises HCl and chlorine, and wherein the magnetic field strength is about 60 gauss.

* * * * *

UNITED STATES PATENT AND TRADEMARK OFFICE
CERTIFICATE OF CORRECTION

PATENT NO. : 4,668,338
DATED : May 26, 1987
INVENTOR(S) : DAN MAYDAN ET AL

It is certified that error appears in the above—identified patent and that said Letters Patent is hereby corrected as shown below:

IN THE SPECIFICATION

Col. 4, line 25, change "allow" to --allowed--.

Col. 4, line 49, change "52" to --53--.

Col. 6, line 18, correct the spelling of "anistropy" to --anisotropy--.

Signed and Sealed this

Sixth Day of October, 1987

Attest:

DONALD J. QUIGG

Attesting Officer

Commissioner of Patents and Trademarks